(12) United States Patent
Matsuda et al.

(10) Patent No.: US 8,852,728 B2
(45) Date of Patent: Oct. 7, 2014

(54) CONDUCTIVE FILM

(71) Applicant: FUJIFILM Corporation, Tokyo (JP)

(72) Inventors: Toyomi Matsuda, Kanagawa-ken (JP);
Makoto Sutou, Minami-ashigara (JP);
Tomonori Baba, Hadano (JP); Daisuke Mitsuhashi, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/741,818

(22) Filed: Jan. 15, 2013

(65) Prior Publication Data
US 2013/0126213 A1 May 23, 2013

Related U.S. Application Data

(62) Division of application No. 12/790,378, filed on May 28, 2010, now Pat. No. 8,383,329.

(30) Foreign Application Priority Data

May 29, 2009 (JP) ................. 2009-131487

(51) Int. Cl.
| | |
|---|---|
| *H05K 9/00* | (2006.01) |
| *H05K 3/00* | (2006.01) |
| *H05K 3/10* | (2006.01) |
| *H01B 5/00* | (2006.01) |
| *G03F 1/00* | (2012.01) |
| *H05K 1/03* | (2006.01) |

(52) U.S. Cl.
CPC ............... *H01B 5/00* (2013.01); *H05K 3/0082* (2013.01); *H05K 2201/0108* (2013.01); *H05K 3/106* (2013.01); *G03F 1/14* (2013.01); *H05K 1/0393* (2013.01); *H05K 2201/09681* (2013.01); *H05K 2203/056* (2013.01); *H05K 2203/1545* (2013.01)
USPC ........... 428/209; 428/312.8; 361/816; 307/91

(58) Field of Classification Search
USPC ................ 428/131–135, 192–194, 209; 307/89–91; 361/816–818
See application file for complete search history.

(56) References Cited

U.S. PATENT DOCUMENTS

2009/0142703 A1 6/2009 Uchida et al.

FOREIGN PATENT DOCUMENTS

| | | |
|---|---|---|
| JP | 2004-221564 A | 8/2004 |
| JP | 2004-221565 A | 8/2004 |
| JP | 2007-072171 A | 3/2007 |
| JP | 2007-102200 A | 4/2007 |
| JP | 2008-283042 A | 11/2008 |
| JP | 2009-252868 A | 10/2009 |
| WO | 2006025266 A1 | 3/2006 |

OTHER PUBLICATIONS

Rejection of the Application, dated Jan. 22, 2013, issued in corresponding JP Application No. 2009-131487, 5 pages in English and Japanese.

*Primary Examiner* — Gwendolyn Blackwell
*Assistant Examiner* — Lucas Wang
(74) *Attorney, Agent, or Firm* — Sughrue Mion, PLLC

(57) ABSTRACT

There are provided a pattern exposure method, a conductive film producing method, and a conductive film, wherein a photosensitive material is subjected to a proximity exposure through a photomask disposed with a proximity gap of 70 to 200 μm, and thereby is exposed in the mask pattern periodically in the conveying direction to obtain a conductive film. The conductive film has a plurality of conductive portions of first and second conductive thin metal wires and a plurality of opening portions. A side of each thin metal wire has a protrusion extending toward the opening portion from a virtual line representing a designed width of the thin metal wire, and the protruding amount of the protrusion is ⅟25 to ⅙ of the designed width.

5 Claims, 10 Drawing Sheets

US 8,852,728 B2

CONDUCTIVE FILM

CROSS-REFERENCE TO RELATED APPLICATION

This application is a divisional application of U.S. application Ser. No. 12/790,378, filed May 28, 2010, which is based upon and claims the benefit of priority from Japanese Patent Application No. 2009-131487 filed on May 29, 2009, each of which is incorporated herein by reference in its entirety.

BACKGROUND OF THE INVENTION

1. Field of the Invention

The present invention relates to a pattern exposure method, a conductive film producing method, and a conductive film, particularly to a pattern exposure method containing proximity-exposing a photosensitive material in a periodic pattern, a conductive film producing method using the pattern exposure method, and a conductive film.

2. Description of the Related Art

In recent years, conductive films obtained by various production methods have been studied. Among them, a silver salt-type conductive film is produced by pattern-exposing an applied silver halide emulsion to form a conductive silver portion for ensuring a conductivity and an opening portion for ensuring a transparency (see, e.g. Japanese Laid-Open Patent Publication Nos. 2004-221564 and 2004-221565). In a known method for producing the silver salt-type conductive film, a photosensitive material is continuously conveyed, subjected to a proximity exposure through a photomask disposed with a proximity gap of 500 μm or less with respect to the photosensitive material, and thereby exposed in the mask pattern periodically in the conveying direction (see, e.g. Japanese Laid-Open Patent Publication Nos. 2007-072171 and 2007-102200). Also, a conductive film produced by a printing method is known (see, e.g. Japanese Laid-Open Patent Publication No. 2008-283042).

In above Japanese Laid-Open Patent Publication No. 2007-072171, a simulation of proximity gap change within a range of 50 to 550 μm is performed to study the relation between the proximity gap and light intensity distribution generated due to optical diffraction (see Paragraph [0126]). As is clear from the simulation results, the light intensity distribution is widened as the proximity gap is increased. In Japanese Laid-Open Patent Publication No. 2007-072171, it is found that a smaller proximity gap is preferred from the viewpoint of exposure quality, and the proximity gap Lg of 50 μm is selected based on the finding.

However, in Japanese Laid-Open Patent Publication No. 2007-072171, though the simulation of proximity gap change within a range of 50 to 550 μm is performed to evaluate the light intensity distribution generated due to optical diffraction, when the conductive film is practically produced, the proximity gap is set to be 50 μm only, and not to a distance other than 50 μm.

In addition, the silver salt-type conductive film has a disadvantage of moire generation in a product.

SUMMARY OF THE INVENTION

In view of the above problems, an object of the present invention is to provide a pattern exposure method and a conductive film producing method capable of producing a conductive film with reduced moire.

Another object of the present invention is to provide a conductive film with reduced moire.

As a result of intense research, the inventors have found that moire can be reduced by controlling a sidewall shape of a mesh pattern in a conductive film. As a result of further research, the inventors have found that there is a moire reduction correlation between a proximity gap and the sidewall shape of the mesh pattern in the conductive film. In the conventional method, a proximity gap is set only to 50 μm for practically producing a conductive film. In contrast, in the above research, various other proximity gaps are used for producing conductive films, and the moire reduction effects are evaluated. As a result, it has been found that a conductive film, in which moire is hardly generated, can be produced by setting the proximity gap to 70 to 200 μm. The present invention has been accomplished based on the findings.

[1] A pattern exposure method according to a first aspect of the present invention, comprising the steps of continuously conveying a strip- or sheet-shaped photosensitive material, and subjecting the photosensitive material to a proximity exposure through a photomask disposed with a proximity gap of 70 to 200 μm from the photosensitive material, thereby exposing the photosensitive material in a periodic pattern corresponding to a mask pattern of the photomask repeated periodically in the conveying direction.

[2] A pattern exposure method according to the first aspect, wherein a latent image is formed in a mesh pattern on the photosensitive material by the exposure, the mesh pattern has a plurality of intersections and lines disposed therebetween, a side of the line has a protrusion extending outward from a virtual line representing a designed width of the line, and a protruding amount of the protrusion is 1/25 to 1/6 of the designed width.

[3] A conductive film producing method according to a second aspect of the present invention, comprising the steps of continuously conveying a strip- or sheet-shaped photosensitive material, subjecting the photosensitive material to a proximity exposure through a photomask disposed with a proximity gap of 70 to 200 μm from the photosensitive material, thereby exposing the photosensitive material in a periodic pattern corresponding to a mask pattern of the photomask repeated periodically in the conveying direction, and developing the exposed photosensitive material to form a metallic silver portion.

[4] A conductive film producing method according to the second aspect, wherein a latent image is formed in a mesh pattern on the photosensitive material by the exposure, the mesh pattern has a plurality of intersections and lines disposed therebetween, a side of the line has a protrusion extending outward from a virtual line representing a designed width of the line, and the protruding amount of the protrusion is 1/25 to 1/6 of the designed width.

[5] A conductive film producing method according to the second aspect, further comprising the step of subjecting the metallic silver portion to a plating treatment.

[6] A conductive film according to a third aspect of the present invention, comprising a plurality of conductive portions of conductive thin metal wires and a plurality of opening portions, wherein a side of the thin metal wire has a protrusion extending toward the opening portion from a virtual line representing a designed width of the thin metal wire, and the protruding amount of the protrusion is 1/25 to 1/6 of the designed width.

[7] A conductive film according to the third aspect, wherein the combination of the conductive portions and the opening portions has a mesh shape, and the conductive portions are formed in a mesh pattern having a plurality of intersections of the conductive thin metal wires.

[8] A conductive film according to the third aspect, wherein the protruding amount is a length from the virtual line representing the designed width of the thin metal wire to the top of the protrusion along a normal line from the virtual line to the top.

[9] A conductive film according to the third aspect, wherein the protrusion has two or more convexes having an aspect ratio (a vertical to horizontal ratio) of 1/5 to 3/2.

[10] A conductive film according to the third aspect, wherein the number of the protrusions is 5 or more per 100 μm of the thin metal wire.

[11] A conductive film according to the third aspect, wherein at least two convexes are formed on the side of the thin metal wire continuously in the extending direction of the thin metal wire.

As described above, the pattern exposure method and the conductive film producing method of the present invention are capable of producing a conductive film with reduced moire.

Furthermore, the conductive film of the present invention exhibits reduced moire.

The above and other objects features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of the pattern exposure method, the conductive film producing method, and the conductive film of the present invention will be described below with reference to FIGS. 1 to 10.

Figure 1:
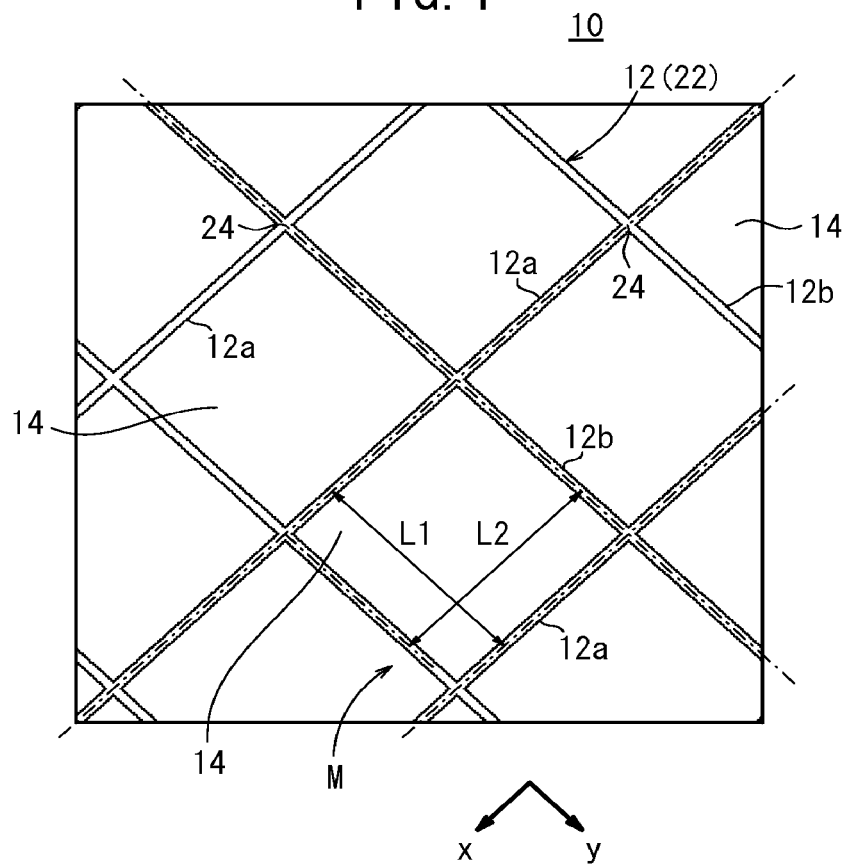
FIG. 1 is a plan view, partially omitted, showing a conductive film according to an embodiment of the present invention.

As shown in FIG. 1, a conductive film 10 according to the embodiment contains a plurality of conductive portions 12 and a plurality of opening portions 14, and the combination of the conductive portions 12 and the opening portions 14 has a mesh shape M. The mesh shape M is a combination of a shape formed by one opening portion 14 and four conductive portions 12 surrounding the opening portion 14. The combination of the conductive portions 12 and the opening portions 14 may have a stripe shape different from the mesh shape M. For example, the stripe shape may be a shape of only a plurality of first thin metal wires 12a arranged, a shape of only a plurality of second thin metal wires 12b arranged, a shape of a plurality of horizontally extending metal wires arranged in the vertical direction, a shape of a plurality of vertically extending metal wires arranged in the horizontal direction, etc.

Figure 2:
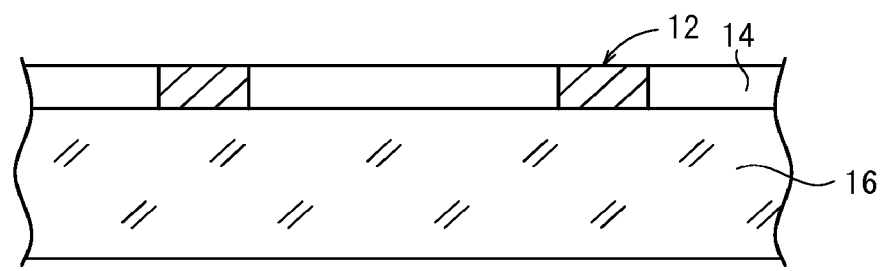
FIG. 2 is a cross-sectional view, partially omitted, showing the conductive film of the embodiment.

As shown in FIG. 2, the conductive film 10 has a transparent film substrate 16, and the conductive portions 12 and the opening portions 14 formed on the transparent film substrate 16. The conductive film 10 of the embodiment can be used in a defroster (defrosting device) or a window glass for a vehicle, a heating sheet for heat generation under an electric current, an electrode for a touch panel, an inorganic EL device, an organic EL device, or a solar cell, or a printed board.

As shown in FIG. 1, the conductive portions 12 in the conductive film 10 has a metal mesh pattern 22 formed by crossing a plurality of the first thin metal wires 12a arranged at a first pitch L1 in one direction (the x direction of FIG. 1) and a plurality of the second thin metal wires 12b arranged at a second pitch L2 in another direction (the y direction of FIG. 1). The first pitch L1 and the second pitch L2 may be 100 to 6000 μm. Each of the first thin metal wires 12a and the second thin metal wires 12b may have a wire width d of 200 μm or less. It is to be understood that the wire width may be 50 μm or less to improve the transparency. The lower limit of the wire width is 2 μm.

Though all the first thin metal wires 12a are arranged at the constant first pitch L1 in the embodiment, some of the first thin metal wires 12a may be arranged at a different pitch. In this case, adjacent first thin metal wires 12a are arranged at respective distances, not at the constant first pitch L1. Also, the second thin metal wires 12b may be arranged in this manner. Thus, the distance between the adjacent first thin metal wires 12a and the distance between the adjacent second thin metal wires 12b are preferably 100 to 6000 μm, more preferably 150 to 1000 μm.

The conductive portions (12) are in the metal mesh pattern 22 having a large number of lattice intersection points (intersections 24) formed by the first thin metal wires 12a and the second thin metal wires 12b. As shown in the enlarged view of FIG. 3, protrusions 26 extend toward the opening portions 14 on the sides of the first thin metal wires 12a and the second thin metal wires 12b between the intersections 24. As shown in FIG. 4A, the protruding amount da of each protrusion 26 is 1/25 to 1/6 of the designed width Wc.

The designed width Wc is an intended wire width of the first thin metal wires 12a and the second thin metal wires 12b.

The intended wire width is controlled mainly by changing a width of a slit in a photomask, through which a light is transmitted. The intended wire width depends on the combination of a photosensitive material, a development treatment, a plating treatment, etc. in addition to the slit width. In each of the first thin metal wires 12a and the second thin metal wires 12b, the number of the protrusions 26 on one side is preferably 5 or more, more preferably 10 or more, per 100 μm of the wire. The wire has approximately the same number of the protrusions 26 on both sides. Therefore, when the wire has five protrusions 26 on one side, it generally has ten protrusions 26 in total of both sides. When the wire has an excessively small number of the protrusions 26, it tends to be insufficient in the moire prevention effect. The upper limit of the number of the protrusions 26 is 50.

Figure 4A:
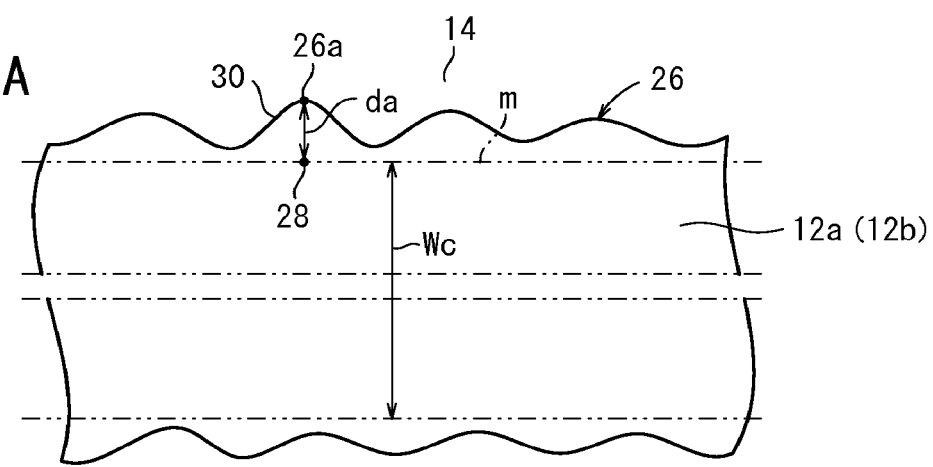
FIG. 4A is an explanatory view showing a side (a protrusion) of the thin metal wire.
Figure 4B:
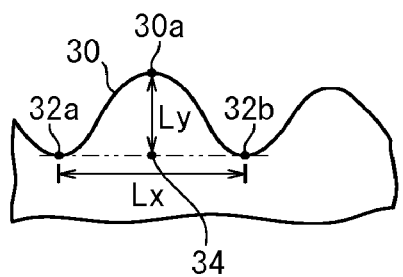
FIG. 4B is an explanatory view showing a convex in the protrusion.

As shown in FIG. 4A, when a normal line is drawn from a virtual line m representing the designed width Wc of the first thin metal wire 12a or the second thin metal wire 12b to a top 26a of the protrusion 26, the protruding amount da is a length (a maximum length) from a base point 28 of the normal line to the top 26a of the protrusion 26. Thus, the protrusion 26 extends toward the opening portion 14 from the virtual line m representing the designed width Wc. The protrusion 26 has two or more convexes 30 having an aspect ratio (a vertical to horizontal ratio) of 1/5 to 3/2. As shown in FIG. 4B, the aspect ratio of the convex 30 is Ly/Lx, wherein Lx represents a length of a line drawn between bottoms of a first concave 32a and a second concave 32b disposed on both sides of the convex 30, and Ly represents a length from a top 30a of the convex 30 to a base point 34 of a normal line drawn between the top 30a and the line. In the present invention, the protruding amount da is controlled mainly by changing a proximity gap Lg. The shape of the protrusion 26 can be controlled by appropriately selecting the types of a photosensitive material, a development treatment, a plating treatment, etc.

Particularly in this embodiment, in each of the first thin metal wires 12a and the second thin metal wires 12b, at least two convexes 30 are formed continuously between two intersections 24. In this case, the convexes 30 are not arranged at a constant pitch and are randomly arranged on both sides of the first thin metal wire 12a. This is true for the second thin metal wire 12b.

Figure 3:
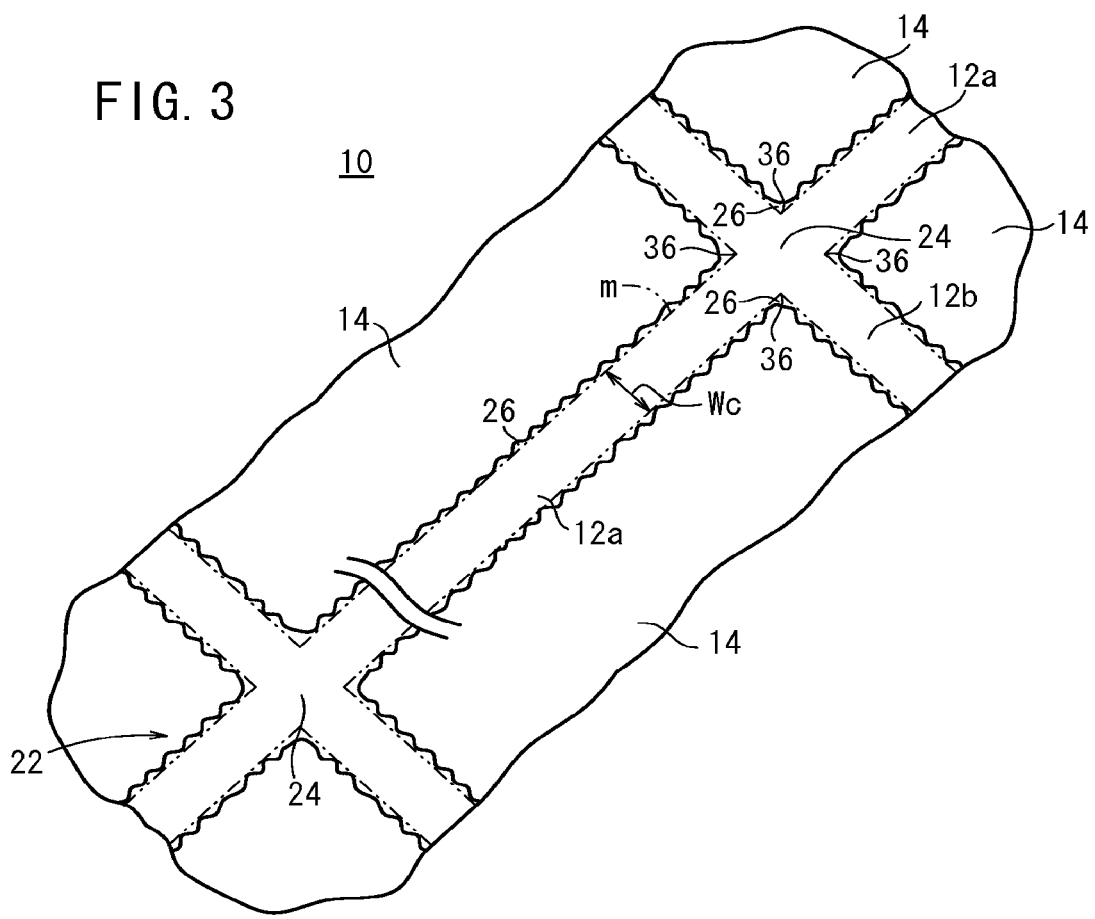
FIG. 3 is an enlarged plan view showing intersections and thin metal wires disposed therebetween in the conductive film of the embodiment.

As shown in FIG. 3, the protrusion 26 having one or more convex and concave extends toward the opening portion 14 also from each of four corners 36 in the intersection 24 (positions in which a side of the first thin metal wire 12a and a side of the second thin metal wire 12b are crossed). The protrusions 26 on the corners 36 may respectively have various shapes, in which one or more convex or concave may be randomly formed.

Figure 5A:
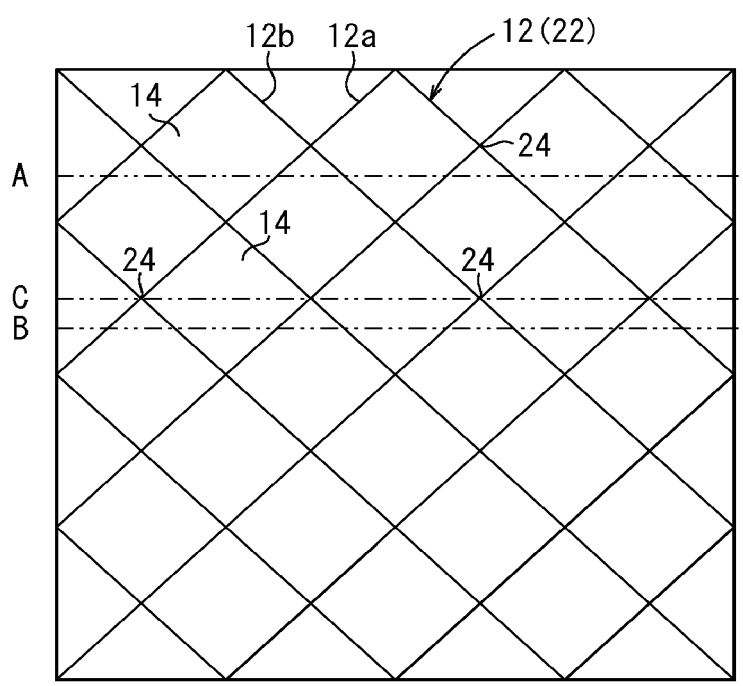
FIG. 5A is a plan view, partially omitted, showing a conductive film using thin metal wires having a designed width.
Figure 5B:
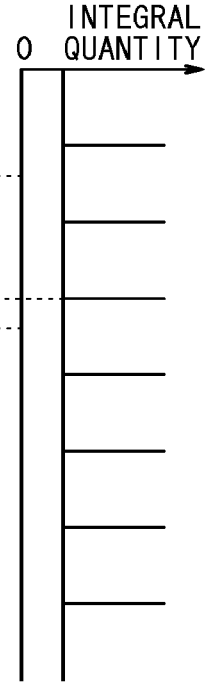
FIG. 5B is a characteristic chart showing the integral quantity of a light transmitted through the conductive film.

In a case where the first thin metal wires 12a and the second thin metal wires 12b having the designed width Wc are formed in the metal mesh pattern 22 without the protrusions 26 as shown in FIG. 5A, the integral quantity of a light transmitted through the opening portions 14 is distributed as shown in FIG. 5B when projected onto one side of the film. In positions other than the intersections 24, such as positions shown by virtual lines A and B, the conductive portions 12 are distributed at the constant ratio, so that the integral quantity is approximately uniform as shown in FIG. 5B. In positions having the intersections 24, two conductive portions 12 are united into one, so that the integral quantity of the transmitted light is increased as shown in FIG. 5B. Such positions, in which the integral quantity is increased, are disposed at a spatial frequency according to the arrangement of the intersections 24.

When an optical filter containing the conductive film having such a transmission property is used in a plasma display panel (hereinafter referred to as the PDP) or the like, moire is generated due to the spatial frequency difference between the PDP pixels and the above-mentioned positions with the increased integral quantity of the transmitted light.

In contrast, in this embodiment, the sidewalls of the first thin metal wires 12a and the second thin metal wires 12b between the intersections 24 have the protrusions 26 extending toward the opening portions 14, and the protrusions 26 has randomly arranged plural concaves and convexes. Therefore, in the positions other than the intersections 24, the integral quantity of the transmitted light is not uniform and varies depending on the randomly arranged plural concaves and convexes. Further, since also the four corners 36 of each intersection 24 have randomly arranged concaves and convexes, the integral quantity of the transmitted light varies also in the positions having the intersections 24. Thus, the integral quantity irregularly varies in the positions without the intersections 24 and the positions with the intersections 24, whereby the generation of the positions with the increased integral quantity at a spatial frequency is suppressed. As a result, the moire is reduced as if the metal mesh pattern 22 of the combination of the conductive portions 12 and the opening portions 14 were not present.

Next, two methods for producing the conductive film 10 according to the embodiment (first and second production methods) will be described below with reference to FIGS. 6A to 6D. The second production method is not shown in the drawings.

In the first production method, a photosensitive silver salt layer is formed, exposed, developed, and fixed on the transparent film substrate 16 to form metallic silver portions in the metal mesh pattern 22.

Figure 6A:
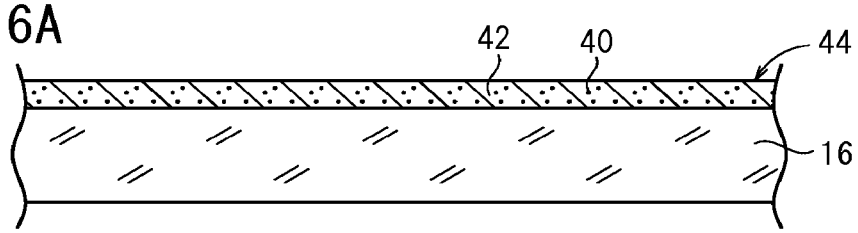
FIG. 6A is a view showing the process of preparing a photosensitive material coated with a photosensitive silver salt layer.

Specifically, as shown in FIG. 6A, a photosensitive material is prepared by coating the transparent film substrate 16 with a photosensitive silver salt layer 44 containing a mixture of a gelatin 42 and a silver halide 40 (e.g., silver bromide particles, silver chlorobromide particles, or silver iodobromide particles). Though the silver halide 40 is exaggeratingly shown as particles in FIGS. 6A to 6D to facilitate understanding, the size, concentration, etc. of the silver halide 40 are not limited to the drawings.

Figure 6B:
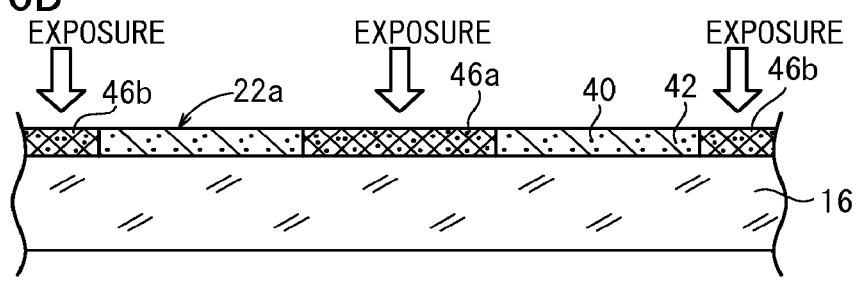
FIG. 6B is a view showing the process of exposing the photosensitive silver salt layer to form a mesh pattern.

Then, as shown in FIG. 6B, the photosensitive silver salt layer 44 is subjected to a necessary exposure treatment for forming first lines 46a to be converted to the first thin metal wires 12a and second lines 46b to be converted to the second thin metal wires 12b. When an optical energy is applied to the silver halide 40, minute silver nuclei are generated to form a latent image of the first lines 46a and the second lines 46b (the metal mesh pattern 22a). For example, a proximity exposure apparatus 100 shown in FIG. 7 may be used in the exposure treatment as described below.

Figure 6C:
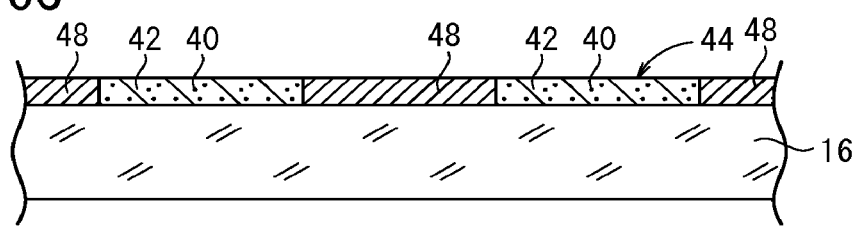
FIG. 6C is a view showing the process of a development treatment.

As shown in FIG. 6C, a development treatment is carried out to convert the latent image of the metal mesh pattern 22a to an image visible to the naked eye. Specifically, the photosensitive silver salt layer 44 having the latent image of the metal mesh pattern 22a is developed using a developer, which is an alkaline or acidic solution, generally an alkaline solution. In the development treatment, using the latent image silver nucleus as a catalyst core, a silver ion from the silver halide particles or the developer is reduced to metallic silver by a reducing agent (a developing agent) in the developer. As a result, the latent image silver nucleus is grown to form a visible silver image (a developed silver 48).

The photosensitive silver halide 40 remains in the photosensitive silver salt layer 44 after the development treatment.

Figure 6D:
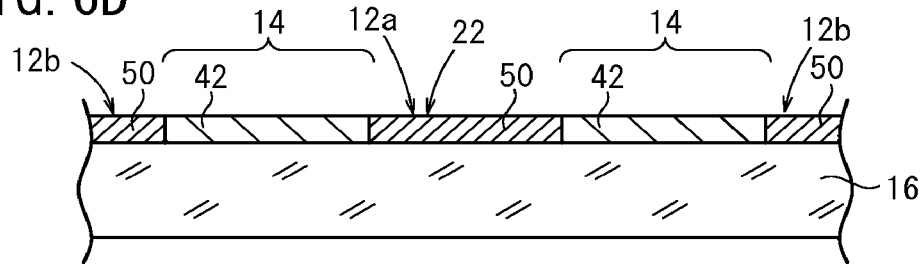
FIG. 6D is a view showing the process of forming a metallic silver portion in the mesh pattern.

As shown in FIG. 6D, the silver halide 40 is removed by a fixation treatment using a fixer, which is an acidic or alkaline solution, generally an acidic solution.

After the fixation treatment, metallic silver portions 50 are disposed in exposed areas, and only the gelatin 42 remains in unexposed areas as the opening portions 14. Thus, the combination of the metallic silver portions 50 (the conductive portions 12) and the opening portions 14 is formed on the transparent film substrate 16. The metallic silver portions 50 may be used as the metal mesh pattern 22 without modification at this stage. The metallic silver portions 50 may be subjected to a plating treatment and may be used as the metal mesh pattern 22 together with a plated layer.

A photomask used in the exposure of the photosensitive silver salt layer 44 has a mask pattern for forming the latent image of the first lines 46a and the second lines 46b as described below.

In the second production method, for example, a copper foil is formed on a transparent film substrate, and a photoresist film is formed on the copper foil to prepare a photosensitive material. The photoresist film in the photosensitive material is subjected to an exposure treatment for forming first lines to be converted to the first thin metal wires and second lines to be converted to the second thin metal wires. The photoresist film is of a negative type, and exposed areas therein are hardened. A mesh pattern corresponding to the desired metal mesh pattern is formed at this stage. The exposure apparatus 100 to be hereinafter described may be used also in this exposure treatment.

Then, the exposed photoresist film is developed to form a resist pattern corresponding to the mesh pattern, and the copper foil exposed from the resist pattern is etched to form the metal mesh pattern.

Also in this method, a photomask used in the exposure of the photoresist film has a mask pattern for forming the first and second lines.

A proximity exposure apparatus (hereinafter referred to as the exposure apparatus 100) useful in the exposure treatment in the production method of the embodiment will be described below with reference to FIGS. 7 to 10.

Figure 7:
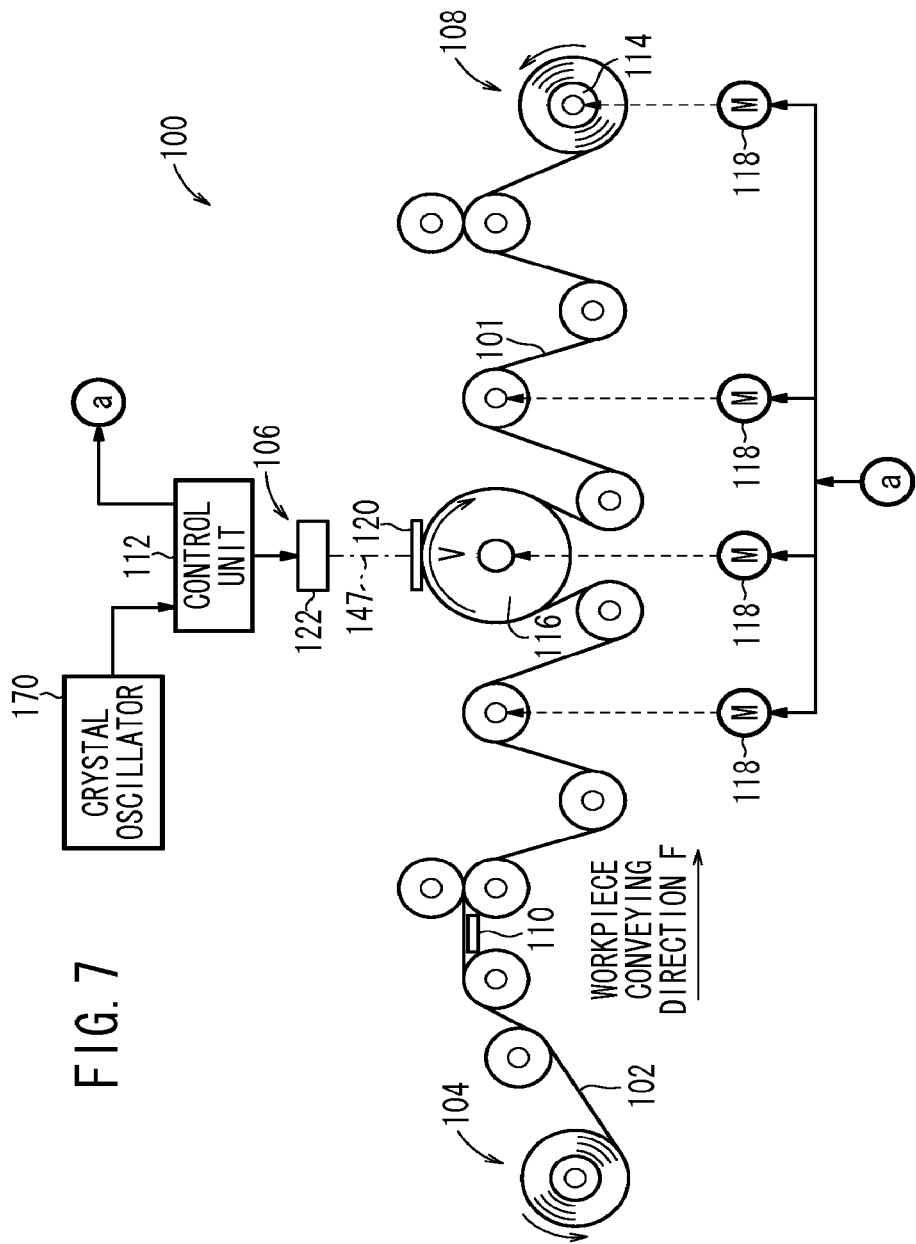
FIG. 7 is a structural view showing an exposure apparatus used in a production method according to the embodiment.

As shown in FIG. 7, the exposure apparatus 100 has a workpiece supply unit 104 for supplying a long photosensitive material 102, an exposure unit 106 for forming the latent image in the mesh pattern 22a of the first lines 46a and the second lines 46b on the photosensitive material 102, a workpiece wind unit 108 for rewinding the exposed photosensitive material 102, a workpiece connection unit 110 for connecting the rear end of the processed photosensitive material 102 to the forward end of a next photosensitive material 102, thereby continuously processing a plurality of the photosensitive materials 102, and a control unit 112 for controlling all the units.

In the long photosensitive material 102, a transparent PET film having a thickness t1 of 100 μm and a width W0 of 650 to 750 mm is used as the transparent film substrate 16, and the photosensitive silver salt layer 44 (according to the first production method) or the copper foil and the photoresist film (according to the second production method) are formed on one surface of the PET film. The long photosensitive material 102 has a length of 100 to 1000 m, and it is wound into a roll and placed in the workpiece supply unit 104.

The forward end of the photosensitive material 102 placed in the workpiece supply unit 104 is pulled out, passed through a plurality of rollers, and fixed to a take-up reel 114 in the workpiece wind unit 108. The take-up reel 114, an exposing roller 116, and a plurality of driving rollers (not shown) are rotated in the winding direction by motors 118, whereby the photosensitive material 102 is conveyed in the workpiece conveying direction F from the workpiece supply unit 104 toward the workpiece wind unit 108. For example, the photosensitive material 102 may be conveyed at a workpiece conveyance rate V of 4 m/minute. The workpiece conveyance rate V may be optimally selected depending on the sensitivity of the photosensitive silver salt layer 44 (or the photoresist film) or the output of an exposure light source.

The exposure unit 106 has a photomask 120 placed around the outer circumference of the exposing roller 116 and a lighting device 122 useful as an exposure light source for emitting a light toward the photomask 120. For example, the photomask 120 may contain a mask substrate and a mask pattern formed on one surface of the mask substrate. The mask substrate may be composed of a transparent soda glass having a thickness t2 of 4.5 mm, a mask length La of 200 mm in the workpiece conveying direction F, and a mask width Wa of 800 mm in the direction perpendicular to the workpiece conveying direction F.

For example, the mask pattern is obtained by forming a desirably shaped slit for transmitting a light through a black-colored light blocking pattern. The mask pattern has the same shape and size as the metal mesh pattern 22, and is formed on the mask substrate by chromium deposition along the workpiece width direction.

Figure 8:
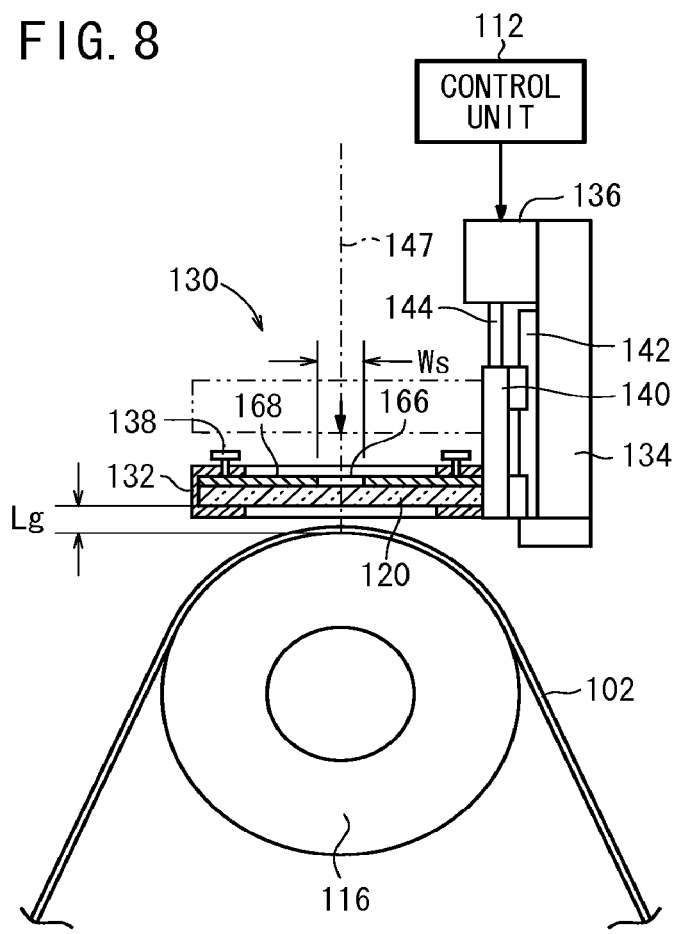
FIG. 8 is a schematic structural view partially showing a mask holder.

The photomask 120 is fixed by a mask holder 130 shown in FIG. 8. The mask holder 130 has a holding frame 132 for fixing the photomask 120, a support 134 for supporting the holding frame 132 movably between an exposure position and a separation position, and an actuator 136 for transferring the holding frame 132 between the exposure position and the separation position. The photomask 120 fixed to the holding frame 132 faces the photosensitive material 102 with the proximity gap Lg in the exposure position, and the photomask 120 is disposed at a distance larger than the proximity gap Lg in the separation position (shown by a two-dot chain line in FIG. 8).

The outer circumference of the photomask 120 is sandwiched and fixed between front and rear parts of the holding frame 132. The holding frame 132 has a plurality of adjust screws 138 arranged in the width direction, which are inserted from the back surface and brought into contact with the photomask 120. The adjust screws 138 are used for finely controlling a small error of the proximity gap Lg in the width direction. By controlling the insertion of each adjust screw 138 into the holding frame 132, the photomask 120 may be moved in the holding frame 132 such that the entire surface is positioned with the constant proximity gap Lg.

The support 134 has a slide guide 140, which is slidably attached to a slide rail 142 and connected to the holding frame 132. The support 134 is used for supporting the holding frame 132 slidably between the exposure position and the separation position. The holding frame 132 is slid on the slide rail 142 between the exposure and separation positions by the actuator 136. The desired proximity gap Lg is achieved by finely controlling a stopper for determining the exposure position on the slide rail 142.

The actuator 136 is attached to the support 134, and a mobile body 144 thereof is connected to the slide guide 140. The actuator 136 is controlled by the control unit 112. The support 134 exhibits excellent position repeatability with high accuracy in the transfer to the exposure position, and therefore the proximity gap Lg is not changed due to the movement of the holding frame 132.

Figure 9:
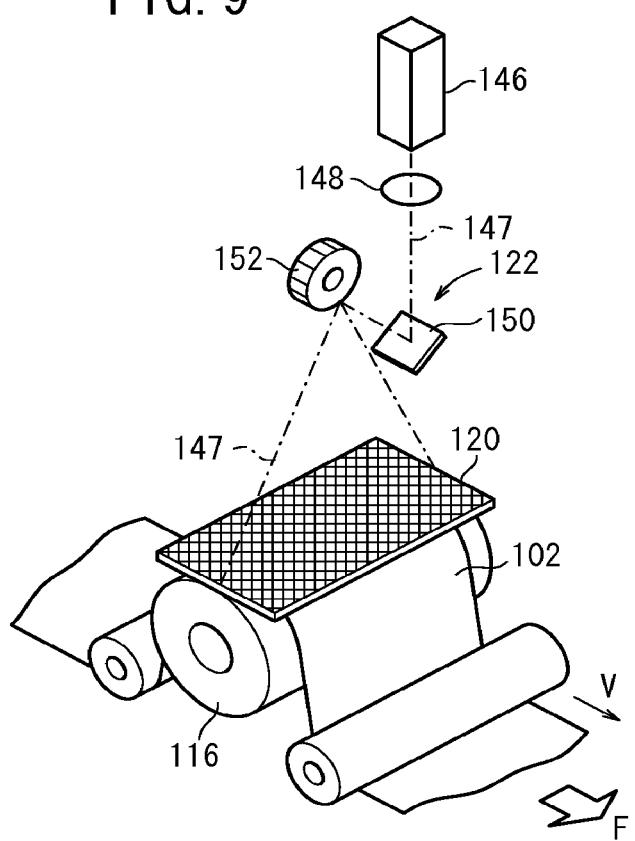
FIG. 9 is a conceptual view showing the operation of an exposure method using the exposure apparatus.

As shown in FIG. 9, the lighting device 122 has a laser output part 146, a collimating lens 148 for collimating a laser light 147 from the laser output part 146 into a parallel light, a reflective mirror 150 for reflecting the laser light 147, a polygon mirror 152 useful as a scanning means, and a motor (not shown).

For example, the laser output part 146 outputs a single-mode semiconductor laser at 60 mW, the laser light 147 from the laser output part 146 has a wavelength of 405 nm suitable for the photosensitive silver salt layer 44, and the collimating lens 148 has a focal length of 3 mm and acts to convert the incident laser light 147 into a parallel light having an ellipsoidal projected shape with a major axis of 3.6 mm and a minor axis of 1.2 mm. The laser light 147 is emitted toward the photomask 120 such that the major axis is parallel to the workpiece conveying direction F and the minor axis is parallel to the workpiece width direction.

A method for forming the latent image in the mesh pattern 22a by using the exposure apparatus 100 will be described below with reference to FIG. 9.

First, the long photosensitive material 102 is conveyed in the workpiece conveying direction shown by an arrow F in FIG. 9. The laser light 147 is emitted from the lighting device 122 toward the photomask 120 during the conveyance. The laser light 147 is transmitted through the slit in the mask pattern of the photomask 120 to the photosensitive material 102. Thus, the photosensitive material 102 is exposed in a periodic pattern at a period length of, e.g., 424 μm along the conveying direction. There is the proximity gap Lg of 70 to 200 μm between the photosensitive material 102 and the photomask 120. The proximity exposure is synchronized with the workpiece conveyance in the period length, whereby the desired periodic pattern is formed by the exposure. In the present invention, the protrusions 26 extending toward the opening portions 14 are formed on the sides of the first thin metal wires 12a and the second thin metal wires 12b between the intersections 24 by controlling the proximity gap Lg within the range of 70 to 200 μm. The protrusions 26 are effective for reducing the moire. The shape of the protrusion 26 can be optimally controlled by selecting the types of the photosensitive material, the development treatment, and the plating treatment.

In the case of using the photosensitive material having the photosensitive silver salt layer, the metallic silver portion 50 is preferably subjected to a plating treatment. The protrusion 26 is thickened and emphasized by the plating treatment, and thereby shows a higher moire reduction effect.

In this embodiment, the photosensitive material 102 is not stopped but continuously conveyed in the proximity exposure. The photosensitive material 102 is proximity-exposed periodically (e.g. with a period corresponding to the 424-μm feed) while fixing the photomask 120 having the mask pattern, so that a region covering at least one period of the entire mask pattern is exposed. When the photosensitive material 102 is once scanned with the laser light 147, the mesh pattern 22a corresponding to the periodic pattern in the workpiece conveying direction F is formed on the photosensitive material 102. The photosensitive material 102 is conveyed the period length in the workpiece conveying direction F in the process, and the exposed area of the photosensitive material 102 is further exposed in the same pattern through the photomask 120. When the workpiece conveyance rate V is synchronized with the exposure period T, the latent image is further exposed in the same pattern without disruption of the periodic pattern. A multiple exposure in one periodic pattern is carried out by repeating the process.

An outline of the exposure process using the exposure apparatus 100 will be described below with reference to the structural view of FIG. 7 and the flowchart of FIG. 10.

Figure 10:
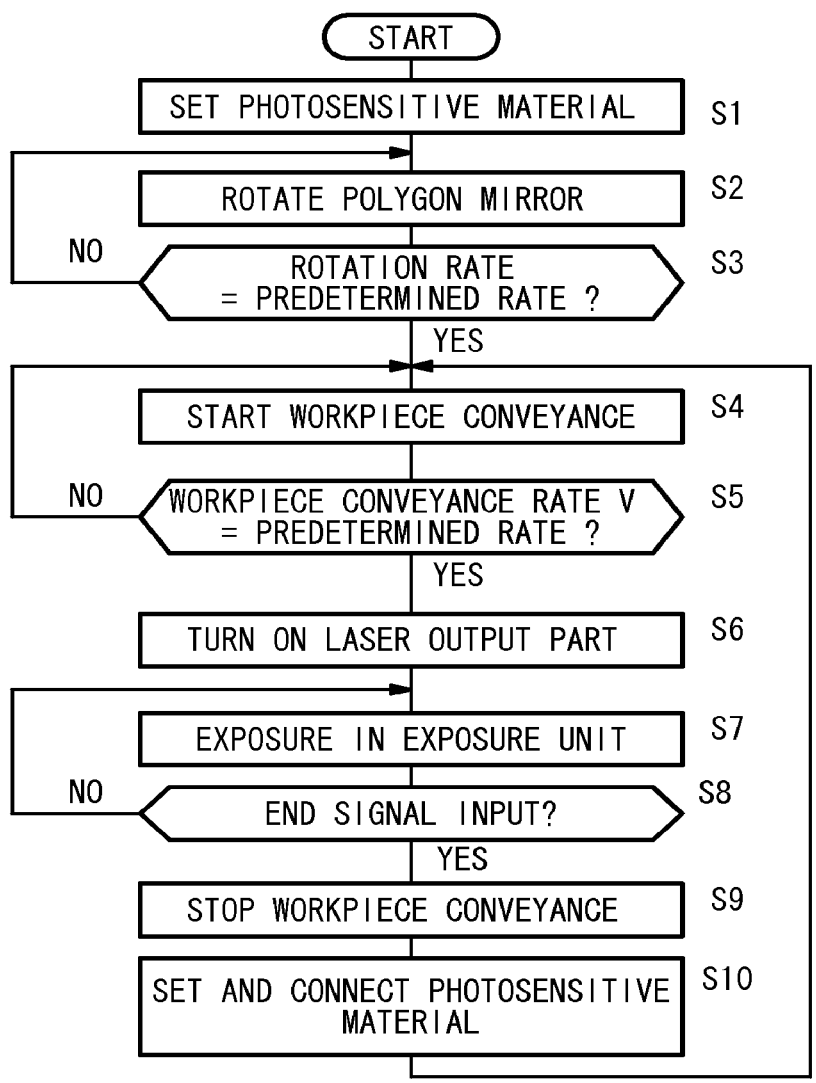
FIG. 10 is a flowchart showing the steps of the exposure method using the exposure apparatus.

First, in the step S1 of FIG. 10, the photosensitive material 102 is set in the workpiece supply unit 104. The photosensitive material 102 contains a long film having a thickness of 100 μm and a width of 650 to 750 mm, coated with the unexposed photosensitive silver salt layer 44 (or the photoresist film). 100 to 1000 m of the photosensitive material 102 is wound around a reel and placed in the workpiece supply unit 104. The forward end of the photosensitive material 102 is fixed to the take-up reel 114 in the workpiece wind unit 108.

In the step S2, the polygon mirror 152 is rotated in the lighting device 122 while keeping the laser output part 146 in the off state.

In the step S3, whether the rotation rate of the polygon mirror 152 reaches a predetermined value is judged by the lighting device 122.

When the rotation rate of the polygon mirror 152 reaches the predetermined value, in the step S4, the conveyance of the photosensitive material 102 is started.

In the step S5, whether the workpiece conveyance rate V reaches a predetermined value is judged. The exposure period T has to be synchronized with the workpiece conveyance rate V to perform the above-mentioned multiple exposure without displacement. The exposure period T can be synchronized with the workpiece conveyance rate V most easily by synchronizing the rotation rate ω of the polygon mirror 152 with the workpiece conveyance rate V. For example, a crystal oscillator 170 (see FIG. 7) is disposed outside as a reference clock, and all the rates are adjusted to the desired constant rates by the control unit 112 using the reference clock, whereby the exposure period T can be properly synchronized with the workpiece conveyance rate V. A scanning start signal for the polygon mirror 152 may be a signal obtained by detecting the laser light 147 used for the scanning using a photodetector such as a photodiode. Alternatively, a leading edge of a control pulse signal for the polygon mirror 152, which is output once per one surface, may be used as the scanning start signal.

When the rotation rate ω of the polygon mirror 152 and the workpiece conveyance rate V reach the predetermined rates, the step goes to the next step S6. Then, the laser light 147 is emitted from the laser output part 146 in the lighting device 122.

The exposure is started after the rotation rate ω of the polygon mirror 152 is synchronized with the workpiece conveyance rate V to easily identify a properly exposed area and a defect area. Even when the exposure is carried out under unsynchronized rotation rate ω and workpiece conveyance rate V, the latent image is formed in the mesh pattern 22a, and the workpiece may appear as a satisfactory article. In this case, a human error inevitably occurs in a visual appearance check for removing the defect area, and the defect area is contained in the product. When the synchronization is monitored by the control unit 112 such that the laser output part 146 is not driven and therefore the exposure is not carried out in the desynchronized state, the defect area can be certainly identified. Thus, the emission of the laser light 147 is automatically stopped in the start/stop desynchronized state.

In the step S7, the photosensitive material 102 is exposed through the photomask 120 to form the latent image in the mesh pattern 22a. The exposure is performed repeatedly to achieve the multiple exposure as described above.

The exposure in the step S7 is repeated until an end signal is output from the control unit 112 in the step S8.

The exposed photosensitive material 102 is wound on the workpiece wind unit 108. When all the photosensitive material 102 is discharged from the workpiece supply unit 104, an end signal is output from the workpiece supply unit 104 to the control unit 112 in the step S8, and the conveyance of the photosensitive material 102 is stopped in the step S9. Then, in the step S10, the end of the photosensitive material 102 is cut in the workpiece connection unit 110, and is connected by a tape to the forward end of another photosensitive material 102 placed in the workpiece supply unit 104.

After the photosensitive materials 102 are connected, the conveyance of the workpiece is started again. When the connected portion between the photosensitive materials 102 passes through the exposing roller 116, the photomask 120 is moved to the separation position by the mask holder 130, and therefore the connection is not brought into contact with the photomask 120. When the connected portion is separated from the exposing roller 116, the photomask 120 is returned to the exposure position with excellent repeatability at the predetermined proximity gap Lg. The laser output part 146 is preferably in the off state when the connected portion is on the exposing roller 116.

When the connected portion is wound on the workpiece wind unit 108, the workpiece conveyance is stopped once, and the wound end is stopped, cut, and fixed by a tape. The wound product is taken out, another take-up reel 114 is placed and chucked, and the cut forward end of the other photosensitive material 102 is fixed to the take-up reel 114. The exposure process is thus completed. Products are produced by repeating the exposure process.

Though the conveyance and winding are carried out along one axis in the embodiment, the exposure apparatus 100 may be such that the conveyance and winding are carried out along two axes to reduce the replacement time. Alternatively, the exposure apparatus 100 may be such that the photosensitive material 102 can be replaced without need of stopping the conveyance by using a reservoir or the like to minimize the loss.

The photosensitive material 102 exposed in the exposure process is then subjected to a development process. The photosensitive material 102 is developed to form the metallic silver portions 50 in the metal mesh pattern 22, whereby the conductive film 10 of the embodiment is obtained.

In the embodiment, the photosensitive material 102 having a strip or sheet shape is continuously conveyed and subjected to the proximity exposure through the photomask 120 disposed with the proximity gap of 70 to 200 μm, and thereby is repeatedly exposed in the mask pattern of the photomask 120 periodically in the conveying direction. As a result, the latent image having the intersections 24 and the first and second lines 46a, 46b disposed therebetween is formed on the photosensitive material 102, the sides of the first and second lines 46a, 46b have the protrusions 26 extending outward from the virtual line representing the designed width Wc of each line, and the protruding amounts of the protrusions 26 are within the range of 1/25 to 1/6 of the designed width Wc. When the photosensitive material 102 is developed to produce the conductive film 10, the sides of the first and second thin metal wires 12a, 12b disposed between the intersections 24 have the protrusions 26 extending toward the opening portions 14 from the virtual line m representing the designed width Wc of each wire, the protruding amounts da of the protrusions 26 are within the range of 1/25 to 1/6 of the designed width Wc, and the protrusions 26 each have the two or more convexes 30 having the aspect ratio (Ly/Lx) of 1/5 to 3/2.

Thus, in the pattern exposure method and the conductive film producing method of the embodiment, the conductive film 10 can be produced with reduced moire.

The method for producing the conductive film 10 of the embodiment, particularly a preferred example using a photographic photosensitive silver halide material will be described in detail below.

As described above, the conductive film 10 of the embodiment may be produced such that the photosensitive material 102 having the transparent film substrate 16 and thereon the photosensitive silver halide-containing emulsion layer is exposed and developed, whereby the metallic silver portions 50 (the conductive portions 12) and the opening portions 14 are formed in the exposed areas and the unexposed areas, respectively.

The method for producing the conductive film 10 of the embodiment includes the following three processes, depending on the photosensitive material 102 and development treatment.

(1) A process comprising subjecting a photosensitive black-and-white silver halide material free of physical development nuclei to a chemical or thermal development, to form the metallic silver portions 50 on the photosensitive material 102.

(2) A process comprising subjecting a photosensitive black-and-white silver halide material having a silver halide emulsion layer containing a physical development nucleus to a solution physical development, to form the metallic silver portions 50 on the photosensitive material 102.

(3) A process comprising subjecting a stack of a photosensitive black-and-white silver halide material free of physical development nuclei and an image-receiving sheet having a non-photosensitive layer containing physical development nucleus to a diffusion transfer development, to form the metallic silver portions 50 on the non-photosensitive image-receiving sheet.

In the process of (1), an integral black-and-white development procedure is used to form a transmittable conductive film such as a light-transmitting electromagnetic-shielding film or a light-transmitting conductive film on the photosensitive material 102. The resulting silver is a chemically or thermally developed silver containing a high-specific surface area filament, and shows a high activity in the following plating or physical development treatment.

In the process of (2), silver halide particles are melted around the physical development nucleus and deposited on the nucleus in the exposed areas, to form a transmittable conductive film such as a light-transmitting electromagnetic-shielding film or a light-transmitting conductive film on the photosensitive material 102. Also in this process, an integral black-and-white development procedure is used. Though high activity can be achieved since the silver halide is deposited on the physical development nucleus in the development, the developed silver has a spherical shape with small specific surface.

In the process of (3), silver halide particles are melted in unexposed areas, and diffused and deposited on the development nucleus of the image-receiving sheet, to form a transmittable conductive film such as a light-transmitting electromagnetic-shielding film or a light-transmitting conductive film on the sheet. In this process, a so-called separate-type procedure is used, and the image-receiving sheet is peeled off from the photosensitive material 102.

A negative development treatment or a reversal development treatment can be used in the processes. In the diffusion transfer development, the negative development treatment can be carried out using an auto-positive photosensitive material 102.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Process, 4th ed.*", Mcmillan, 1977.

(Photosensitive Material 102)

[Transparent Film Substrate 16]

The transparent film substrate 16 used in the production method of the embodiment may be a plastic film, etc.

In this embodiment, it is preferred that the plastic film is a polyethylene terephthalate film or a triacetyl cellulose (TAC) film from the viewpoints of light transmittance, heat resistance, handling, and cost.

In the case of using the conductive film 10 in a transparent heating element for a window glass, the transparent film substrate 16 preferably has a high light transmittance. In this case, the total visible light transmittance of the plastic film is preferably 70% or more, more preferably 85% or more, particularly preferably 90% or more. The plastic film may be colored as long as it does not interfere with the advantageous effects of the present invention.

The thickness of the transparent film substrate 16 may be 0.001 mm (1.0 µm) to 2.0 mm, and is preferably 5 to 350 µm. When the thickness is 5 to 350 µm, a desired visible light transmittance can be obtained, and the film can be easily handled. In view of the weight, adhesion, deformation, etc. of the transparent film substrate 16 wound around the roll as described above, the thickness is more preferably 200 µm or less, further preferably 20 to 180 µm, most preferably 50 to 120 µm.

[Protective Layer]

A protective layer may be formed on the emulsion layer of the photosensitive material 102. The protective layer used in the embodiment contains a binder such as a gelatin or a high-molecular polymer, and is formed on the photosensitive emulsion layer to improve the scratch prevention or mechanical property.

[Emulsion Layer]

The photosensitive material 102 used in the production method of the embodiment preferably has the transparent film substrate 16 and thereon the emulsion layer containing the silver salt (the photosensitive silver salt layer 44) as a light sensor. In this embodiment, the emulsion layer may contain a dye, a binder, a solvent, etc. in addition to the silver salt if necessary.

The silver salt used in the embodiment is preferably an inorganic silver salt such as a silver halide, and is particularly preferably used in the state of silver halide particles for a photographic photosensitive silver halide material. The silver halide is excellent in light sensing property.

A binder may be used in the emulsion layer to uniformly disperse the silver salt particles and to help the emulsion layer adhere to the substrate. In the present invention, though the binder may be composed of a water-insoluble or water-soluble polymer, and preferably contains a water-soluble polymer.

Examples of the binders include gelatins, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, and carboxycelluloses. The binders show a neutral, anionic, or cationic property due to ionicity of a functional group.

The amount of the binder in the emulsion layer is not particularly limited, and may be appropriately selected to obtain sufficient dispersion and adhesion properties.

The solvent used for forming the emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In the present invention, the mass ratio of the solvent to the total of the silver salt, the binder, and the like in the emulsion layer is 30% to 90% by mass, preferably 50% to 80% by mass.

[Metallic Silver Portion 50]

The thickness of the metallic silver portion 50 may be appropriately selected by controlling the thickness of the photosensitive silver salt layer 44 applied to the transparent film substrate 16. The thickness of the metallic silver portion 50 may be 0.001 to 0.2 mm, and is preferably 30 µm or less, more preferably 20 µm or less, further preferably 0.01 to 9 µm, most preferably 0.05 to 5 µm. The metallic silver portion 50 is preferably formed in a patterned shape. The metallic silver portion 50 may have a monolayer structure or a multilayer structure containing two or more layers. In a case where the metallic silver portion 50 has a patterned multilayer structure containing two or more layers, the layers may have different wavelength color sensitivities, and different patterns may be formed in the layers by using exposure lights with different wavelengths.

[Mesh Pattern 22]

The wire width of the conductive portion 12 in the mesh pattern 22 may be selected within a range of 200 µm (0.2 mm) or less. In the case of using the conductive portion 12 for a transparent heating element, the wire width is preferably 5 to 50 µm, more preferably 5 to 30 µm, most preferably 10 to 25 µm. The wire distance of the mesh pattern 22 is preferably 50 to 500 µm, more preferably 200 to 400 µm, most preferably 250 to 350 µm. The mesh pattern 22 may have a part with a wire width of more than 20 µm for the purpose of ground connection, etc.

In the conductive film 10, the opening portions 14 are light transmittable portions other than the conductive portions 12 in the mesh pattern 22. The transmittance of the opening portion 14 is 90% or more, preferably 95% or more, more preferably 97% or more, further preferably 98% or more, most preferably 99% or more. The transmittance is herein a minimum transmittance value in a wavelength region of 380 to 780 nm, obtained neglecting the light absorption and reflection of the transparent film substrate 16.

The aperture ratio of the mesh pattern 22 is preferably 85% or more, more preferably 90% or more, most preferably 95% or more, in view of the visible light transmittance. The aperture ratio is a ratio of the opening portions 14 other than the conductive portions 12 in the mesh pattern 22 to the whole. For example, a square lattice mesh having a wire width of 15 µm and a pitch of 300 µm has an aperture ratio of 90%.

It is preferred that the mesh pattern 22 has a continuous structure with a length of 3 m or more from the viewpoint of maintaining a high productivity of the conductive film 10. As the length of the continuous structure of the mesh pattern 22 is increased, the productivity can be further improved. Thus, in this case, the production loss of a transparent heating element can be reduced.

The length of the mesh pattern 22 is preferably 2000 m or less. When the mesh pattern 22 having an excessively large number of the continuously printed mesh shapes M is formed into a roll, the roll is disadvantageous in large diameter, heavy weight, and high pressure applied to the roll center, causing adhesion or deformation, etc. The length is preferably 3 m or more, more preferably 100 to 1000 m, further preferably 200 to 800 m, most preferably 300 to 500 m.

[Adhesive Layer]

The conductive film 10 of the embodiment may be bonded to a window glass, etc. by an adhesive layer.

Each steps for producing the conductive film will be described in detail below.

[Exposure]

The exposure is preferably carried out using the above described exposure apparatus 100. The exposure apparatus 100 is described in detail above, so that detailed explanations thereof are here omitted.

[Development]

In the embodiment, the emulsion layer is subjected to the development treatment after the exposure. Common development treatment technologies for photographic silver salt films, photographic papers, print engraving films, emulsion masks for photomasking, and the like may be used in the present invention.

In the embodiment, the development process may contain a fixation treatment for removing the silver salt in unexposed areas to stabilize the material. Common fixation treatment technologies for photographic silver salt films, photographic papers, print engraving films, emulsion masks for photomasking, and the like may be used in the present invention.

The developed and fixed photosensitive material is preferably subjected to a water washing treatment or a stabilization treatment.

The mass ratio of the metallic silver contained in the exposed area after the development to the silver contained in the area before the exposure is preferably 50% or more, more preferably 80% or more by mass. When the mass ratio is 50% by mass or more, a high conductivity can be easily achieved.

[Physical Development and Plating Treatment]

In this embodiment, to increase the conductivity of the metallic silver portion 50 formed by the exposure and development, conductive metal particles may be deposited on the metallic silver portion 50 by a physical development and/or a plating treatment. The conductive metal particles can be deposited on the metallic silver portion 50 by only one or both of the physical development and the plating treatment in the embodiment.

In the case of using the mesh pattern 22 in a transparent heating element, the conductive portion 12 in the mesh pattern 22 preferably has a smaller thickness. As the thickness is reduced, the viewing angle of the window glass is increased, and the heating efficiency of the transparent heating element is improved. Thus, the thickness of the layer composed of the conductive metal particles is preferably less than 9 μm, more preferably at least 0.1 μm and less than 5 μm, further preferably at least 0.1 μm and less than 3 μm.

In this embodiment, the thickness of the metallic silver portion 50 can be controlled by changing the coating thickness of the photosensitive silver salt layer 44, and the thickness of the layer composed of the conductive metal particles can be controlled in the physical development and/or the plating treatment, whereby the conductive film 10 having a thickness of less than 5 μm, preferably less than 3 μm, can be easily produced.

In conventional etching methods, most of a thin metal film must be removed and discarded by etching. In contrast, in this embodiment, the pattern containing only a minimum amount of the conductive metal can be formed on the transparent film substrate 16. Thus, only the minimal amount of the metal is used, so that production costs and metal waste amount can be reduced.

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

(Silver Halide Photosensitive Material)

An emulsion containing an aqueous medium, a gelatin, and silver iodobromochloride particles was prepared. The silver iodobromochloride particles had an I content of 0.2 mol %, a Br content of 40 mol %, and an average spherical equivalent diameter of 0.1 μm, and the amount of the gelatin was 10.0 g per 60 g of Ag.

$K_3Rh_2Br_9$ and $K_2IrCl_6$ were added to the emulsion at a concentration of $10^{-7}$ mol/mol-silver to dope the silver halide particles with Rh and Ir ions. $Na_2PdCl_4$ was further added to the emulsion, and the resultant emulsion was gold-sulfur-sensitized using chlorauric acid and sodium thiosulfate. The obtained emulsion and a gelatin hardening agent were applied to a polyethylene terephthalate (PET) support such that the amount of the applied silver was 1 g/m². The Ag/gelatin volume ratio was 1/2.

The PET support had a width of 30 cm, and the emulsion was applied thereto into a width of 25 cm and a length of 20 m. The both end portions having width of 3 cm of the PET support were cut off to obtain a roll photosensitive silver halide material having a width of 24 cm.

(Exposure)

The photosensitive silver halide material was exposed using the above exposure apparatus 100. Thus, the photosensitive silver halide material was subjected to a proximity exposure through the photomask 120 disposed with a predetermined proximity gap while continuously conveying the material. The light for the exposure had a wavelength of 400 nm and a beam shape of approximately 12-μm square, and the output of the laser light source was 100 μJ.

The photosensitive silver halide material was exposed in a continuous lattice pattern (the mesh pattern 22) with a width of 24 cm and a length of 10 m. In the lattice pattern, 12-μm mesh shapes M were tilted at 45 degree at a pitch of 300 μm.

(Development)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |
| Formulation of 1 L of fixer | |
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents under the following conditions using an automatic processor FG-710PTS manufactured by FUJI-FILM Corporation to obtain conductive film samples. A development treatment was carried out at 35° C. for 30 seconds, a fixation treatment was carried out at 34° C. for 23 seconds, and then a water washing treatment was carried out for 20 seconds at a water flow rate of 5 L/min.

The running conditions were such that the amount of the treated photosensitive material was 100 m²/day, the replenishment amount of the developer was 500 ml/m², the replenishment amount of the fixer was 640 ml/m², and the treatment period was 3 days.

Comparative Examples 1 to 3

As shown in Table 1, the proximity gaps Lg used in the proximity exposure in Comparative Examples 1 to 3 were 30, 50, and 220 μm, respectively.

Examples 1 to 5

As shown in Table 1, the proximity gaps Lg used in the proximity exposure in Examples 1 to 5 were 70, 100, 150, 180, and 200 μm, respectively.

[Evaluation]
(Ratio of Protruding Amount of Thin Metal Wire to Designed Width)

An image of a thin metal wire in the conductive film 10 viewed from above was taken by an image pickup apparatus, the maximum width Wm of the thin metal wire was measured by using an image recognition software, and the ratio of the protruding amount of the thin metal wire to the designed width Wc was calculated using the equation: Ratio={(Wm−Wc)/2}/Wc.

(Occurrence of Pattern Blurring in Thin Metal Wire)

When the formed thin metal wires have an average width smaller than the designed width, the thin metal wires were evaluated as "Blurred". When the formed thin metal wires have an average width larger than the designed width, the thin metal wires were evaluated as "Unblurred".

(Moire Evaluation)

The original electromagnetic shielding film was detached from a PDP TH-42PX300 manufactured by Panasonic Corporation. A turntable was disposed on the PDP for the purpose of attaching the above produced conductive film 10 thereto. The turntable was a glass plate having a thickness of 5 mm usable as a front plate of the PDP. Further, the turntable had an angle scale for measuring the bias angle of the attached conductive film 10. The PDP was turned on, and a pattern generator (ASTROVG828D) was connected to an HDMI terminal of the PDP. A white 255 signal was transmitted at the maximum output from the pattern generator to the PDP. The conductive film 10 was fixed to the turntable using a tape to prevent the deflection. The moire of the conductive film 10 was visually observed and evaluated in a dark room while turning the turntable within a bias angle range of −45° to +45°. The moire was observed at a distance of 1.5 m from the PDP while changing the bias angle, and evaluated as "Excellent", "Good", or "Poor". Excellent means that the moire was not visible, Good means that the moire was slightly visible to an acceptable extent, and Poor means that the moire was highly visible. In the overall evaluation, each conductive film 10 was evaluated as "A", "B", "C", "D", or "E". "A" means that the film was evaluated as Excellent in an angular range of 20° or more, "B" means that the film was evaluated as Excellent in an angular range of 10° or more but less than 20°, "C" means that the film was evaluated as Excellent in an angular range of less than 10°, "D" means that the film was not evaluated as Excellent at any angle and was evaluated as Poor in an angular range of less than 10°, and "E" means that the film was not evaluated as Excellent at any angle and was evaluated as Poor in an angular range of 10° or more.

(Evaluation Results)

The evaluation results are shown in Table 1.

TABLE 1

| | Proximity Gap (μm) | Ratio of Protruding Amount to Designed Width | Protrusion Number/ 100 μm | Occurrence of Pattern Blurring | Moire Evaluation |
|---|---|---|---|---|---|
| Comparative Example 1 | 30 | 1/40 | nil | Unblurred | E |
| Comparative Example 2 | 50 | 1/30 | 1 | Unblurred | C |
| Example 1 | 70 | 1/25-1/8 | 10 | Unblurred | B |
| Example 2 | 100 | 1/25-1/6 | 20 | Unblurred | A |
| Example 3 | 150 | 1/25-1/6 | 10 | Unblurred | B |
| Example 4 | 180 | 1/25-1/6 | 10 | Unblurred | B |
| Example 5 | 200 | 1/25-1/6 | 10 | Unblurred | B |
| Comparative Example 3 | 220 | — | — | Blurred | E |

The protrusion number means the number of the protrusions formed on one side of the thin metal wire per 100 μm of the wire. Five thin metal wires were selected from 1 cm² of each conductive film, the number of the protrusions formed on one side of each wire was counted per 100 μm, and the average value of the counted numbers was obtained as the protrusion number. The protrusion number of "nil" of Comparative Example 1 means that the protrusions 26 had vanishingly small sizes with the ratio 1/40 of the protruding amount to the designed width.

As shown in Table 1, in Comparative Example 3, the pattern blurring was caused due to the small exposure amount. In contrast, in Examples 1 to 5 and Comparative Examples 1 and 2, the pattern blurring was not observed.

In Comparative Examples 1 and 2, the ratios of the protruding amount to the designed width of the thin metal wire were 1/40 and 1/30, respectively. In Examples 1 to 5, the ratios were within the range of 1/25 to 1/6. In Comparative Example 3, the ratio could not be obtained due to the significant pattern blurring.

In Example 2, the conductive film was evaluated as "A" with respect to the moire and hardly had significant moire. In Examples 1 and 3 to 5, the conductive films were evaluated as "B" and hardly had significant moire, though inferior to Example 2. In contrast, in Comparative Examples 1 and 3, the conductive films were evaluated as "E" and had significant moire. In Comparative Example 2, the moire was reduced though not to the extent of Examples 1 and 3 to 5.

In Examples 1 to 5, a plurality of convexes having aspect ratios of 1/5 to 3/2 were randomly arranged in each protrusion.

It is to be understood that the pattern exposure method, the conductive film producing method, and the conductive film of the present invention are not limited to the above embodiments, and various changes and modifications may be made therein without departing from the scope of the present invention.

What is claimed is:
1. A conductive film comprising a plurality of conductive portions of conductive thin metal wires and a plurality of opening portions, wherein
a side of the thin metal wire has a protrusion extending toward the opening portion from a virtual line representing a designed width of the thin metal wire, and the protruding amount of the protrusion is ⅟₂₅ to ⅙ of the designed width,
wherein the protruding amount is a length from the virtual line representing the designed width of the thin metal wire to the top of the protrusion along a normal line from the virtual line to the top, and
wherein the protrusion has two or more convexes having an aspect ratio of a height to width of 1/5 to 3/2.

2. A conductive film according to claim 1, wherein the combination of the conductive portions and the opening portions has a mesh shape, and
the conductive portions are formed in a mesh pattern having a plurality of intersections of the conductive thin metal wires.

3. A conductive film according to claim 1, wherein a number of the protrusions is 5 or more per 100 μm of the thin metal wire.

4. A conductive film according to claim 1, wherein at least two convexes are formed on the side of the thin metal wires continuously in the extending direction of the thin metal wire.

5. The conductive film according to claim 2, wherein the protrusion having the two or more convexes is formed between each intersection of conductive thin metal wires.

\* \* \* \* \*